(12) United States Patent
Marlett et al.

(10) Patent No.: US 8,446,169 B1
(45) Date of Patent: May 21, 2013

(54) IMPEDANCE TUNING FOR TERMINATION

(75) Inventors: Mark J. Marlett, Livermore, CA (US); Khaldoon S. Abugharbieh, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/219,405

(22) Filed: Aug. 26, 2011

(51) Int. Cl.
*H03K 17/16* (2006.01)
*H03K 19/003* (2006.01)
*H03K 19/094* (2006.01)
*H03K 3/00* (2006.01)
*H03B 1/00* (2006.01)

(52) U.S. Cl.
USPC .............................. 326/30; 326/87; 327/108

(58) Field of Classification Search
USPC ...... 326/30, 87; 327/108, 109, 170, 172–176; 365/189.05, 189.11
See application file for complete search history.

(56) References Cited

PUBLICATIONS

Dettloff, W.D., et al., A 32mW 7.4 Gb/s Protocol-Agile Source-Series-Terminated Transmitter in 45 nm CMOS SOI, 2010 IEEE International Solid-State Circuits Conference, Digest of Technical Papers, ISSCC 2010, Session 20, Next-Generation Optical & Electrical Interfaces, 20.6, Feb. 7-11, 2010, pp. 370-371.
Kossel, M., et al., A T-Coil-Enhanced 8.5 Gb/s High-Swing SST Transmitter in 65 nm Bulk CMOS With 16dB Return Loss Over 10 Ghz Bandwidth, IEEE Journal of Solid-State Circuits, vol. 43, Issue 12, Dec. 2008, pp. 2905-2920.
Menolfi, C. et al., A 16Gb/s Source-Series Terminated Transmitter in 65nm CMOS SOI, 2007 IEEE International Solid-State Circuits Conference, Digest of Technical Papers, ISSCC 2007, Session 24, Multi-GBs, Transceivers, 24.6, Feb. 11-15, 2007, pp. 446-614.
Philpott, R.A., et al., A 20Gb/s SerDes Transmitter with Adjustable Source Impedance and 4-tap Feed-Forward Equalization in 65nm bulk CMOS, IEEE 2008 Custom Integrated Circuits Conference (CICC), Sep. 21-24, 2008, pp. 623-626.

*Primary Examiner* — Shawki Ismail
*Assistant Examiner* — Dylan White
(74) *Attorney, Agent, or Firm* — W. Eric Webostad; Gerald Chan

(57) ABSTRACT

An embodiment of an impedance adjustment apparatus is disclosed. For this embodiment of an impedance adjustment apparatus, a differential driver circuit has an input port, a first output port, a second output port, a first bias node, and a second bias node. A first impedance-voltage device is coupled to provide a first bias voltage to the first bias node. A second impedance-voltage device is coupled to provide a second bias voltage to the second bias node. A first analog voltage source is coupled to provide a first analog voltage to the first impedance-voltage device, and a second analog voltage source is coupled to provide a second analog voltage to the second impedance-voltage device.

20 Claims, 14 Drawing Sheets

| Total Number of Units | Number of Main Cursor Unit(s) | Number of Post Cursor Unit(s) | Post Cursor Decibels (dB) |
|---|---|---|---|
| N | N | 0 | 20 log (N/N) |
| N | N-1 | 1 | 20 log ((N-1)/N) |
| N | N-m | m | 20 log ((N-m)/N) |

| Total Number of Units | Number of Main Cursor Unit(s) | Number of Precursor Unit(s) | Precursor Decibels (dB) |
|---|---|---|---|
| N | N | 0 | 20 log (N/N) |
| N | N-1 | 1 | 20 log ((N-1)/N) |
| N | N-m | m | 20 log ((N-m)/N) | ced
IMPEDANCE TUNING FOR TERMINATION

FIELD OF THE INVENTION

An embodiment of the invention relates to integrated circuit devices ("ICs"). More particularly, an embodiment of the invention relates to impedance tuning for termination for an IC.

BACKGROUND

Low-power or high-speed data transmission may involve transmitters with Source-Series-Terminated ("SST") or Voltage Mode Line ("VML") drivers. Even though the following description is in terms of SST drivers, such description is likewise applicable to VML drivers and the like.

Signal swing or return loss performance of SST and SST-like devices depends in part on matching transmission impedance. By way of example and not limitation, field effect transistor ("FET") device sizes and linear internal transistors may have to match impedance of external resistors, such as 100 ohms for differential and 50 ohms for single ended termination. Unfortunately, process-voltage-temperature ("PVT") variation may render such impedance matching problematic.

Accordingly, it is desirable and useful to provide impedance tuning for source termination that is adaptable to PVT.

SUMMARY

One or more embodiments generally relate to impedance tuning for termination.

An embodiment relates generally to an apparatus for impedance adjustment. In such an embodiment, a differential driver circuit has an input port, a first output port, a second output port, a first bias node, and a second bias node. A first impedance-voltage device is coupled to provide a first bias voltage to the first bias node. A second impedance-voltage device is coupled to provide a second bias voltage to the second bias node. A first analog voltage source is coupled to provide a first analog voltage to the first impedance-voltage device, and a second analog voltage source is coupled to provide a second analog voltage to the second impedance-voltage device.

An embodiment relates generally to a method for impedance adjustment. In such an embodiment, a first analog voltage is output from a first analog voltage source in response to a first digital output. A second analog voltage is output from a second analog voltage source in response to a second digital output. The first analog voltage is applied to a first impedance-voltage device to provide a first channel resistance. The second analog voltage is applied to a second impedance-voltage device to provide a second channel resistance. A first bias voltage is obtained from the first impedance-voltage device responsive to the first channel resistance, where the first impedance-voltage device is sourced from a supply voltage. A second bias voltage is obtained from the second impedance-voltage device responsive to the second channel resistance, where the second impedance-voltage device is sourced from a ground. The first bias voltage is provided to a first bias node of a differential driver circuit. The second bias voltage is provided to a second bias node of the differential driver circuit. An input voltage is provided to an input port of the differential driver circuit. A logic high voltage is output from a first output port of the differential driver circuit, and a logic low voltage is output from a second output port of the differential driver circuit.

An embodiment relates generally to another apparatus for impedance adjustment. In such an embodiment, a differential driver circuit has an input port, a first output port, a second output port, a first bias node, and a second bias node. A reference resistance circuit has a first tap and a second tap. A feedback control circuit is coupled to the first output port, the second output port, the first tap, and the second tap. The feedback control circuit is configured to provide a first digital output in response to a first relationship between first voltages at the first output port and the first tap. The feedback control circuit is further configured to provide a second digital output in response to a second relationship between second voltages at the second output port and the second tap. The first digital output is provided to select a number of pull-up slices, and the second digital output is provided to select a number of pull-down slices.

BRIEF DESCRIPTION OF THE DRAWINGS

Accompanying drawings show exemplary embodiments in accordance with one or more aspects of the invention. However, the accompanying drawings should not be taken to limit the invention to the embodiments shown, but are for explanation and understanding only.

DETAILED DESCRIPTION

Figure 1:
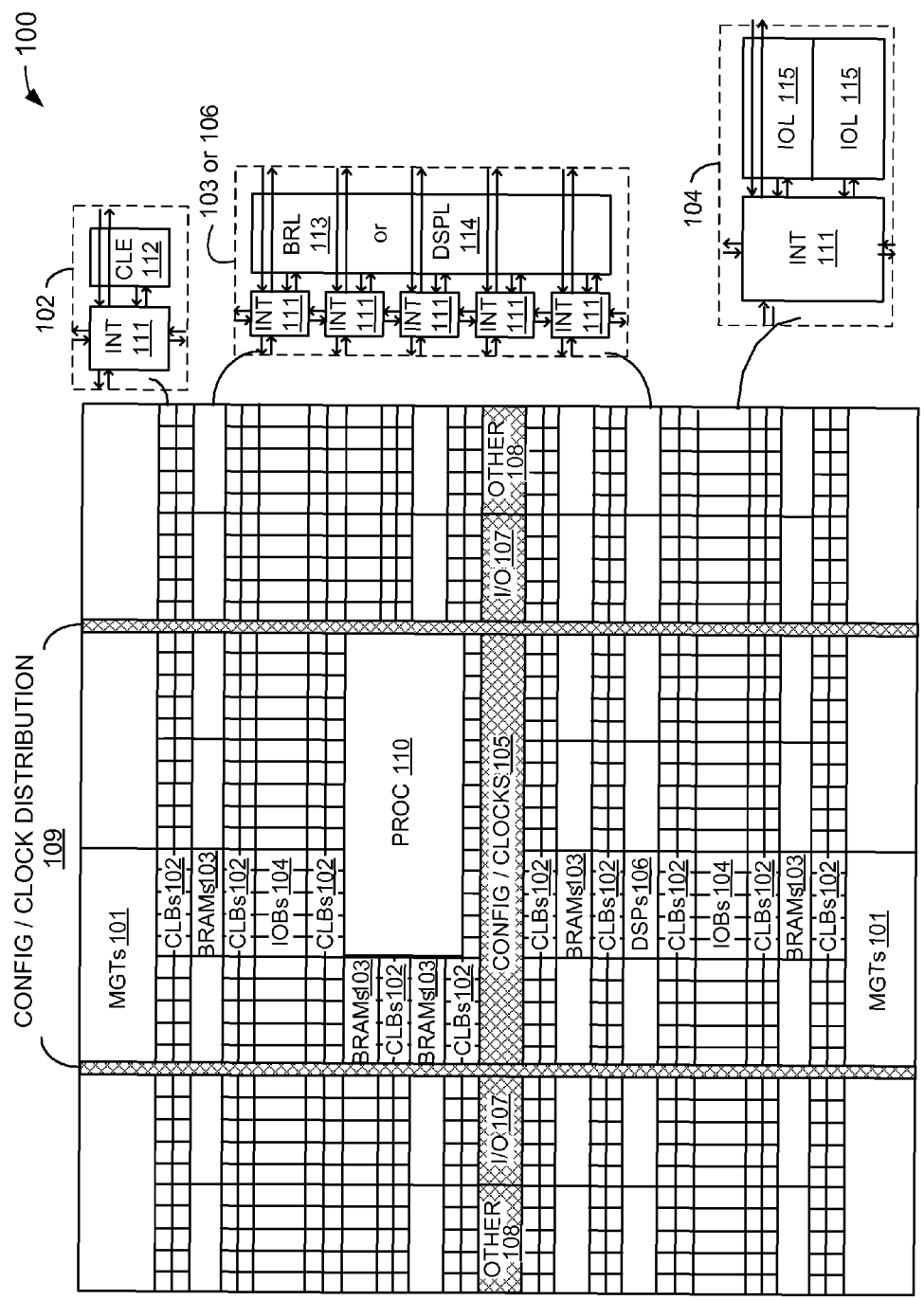
FIG. 1 is a simplified block diagram depicting an exemplary embodiment of a Field Programmable Gate Array ("FPGA") architecture in which one or more aspects of the invention may be implemented.

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Before describing exemplary embodiments illustratively depicted in the several figures, a general introduction is provided to further understanding. Controlling output swing and/or return loss performance of a transmitter driver may be enhanced with impedance tuning. As described below in additional detail, a feedback control is provided for such impedance tuning. Such feedback control may be used to produce an analog voltage for such impedance tuning. The ability to tune the impedance of a slice while keeping the number of slices in a transmitter driver the same may simplify design of circuitry. For example, implementation of cursor settings for a filter may be simplified, because the number of slices of such filter may remain fixed. Alternatively, the number of slices in a driver may be changed without changing impedance of any or all slices in such driver.

Impedance may be adjusted by feedback control of output voltages of a replica driver, which may include one or more slices. Thus, a single reference slice may be a replica of a driver ("replica driver" or "replica slice"). As described below in additional detail, such feedback control facilitates promoting stability in view of PVT variation. Promoting such stability may facilitate output swing stability and/or improve return loss performance.

With the above general understanding borne in mind, various embodiments for impedance tuning for termination are generally described below.

Because one or more of the above-described embodiments are exemplified using with a particular type of IC, a detailed description of such an IC is provided below. However, other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of I/O logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
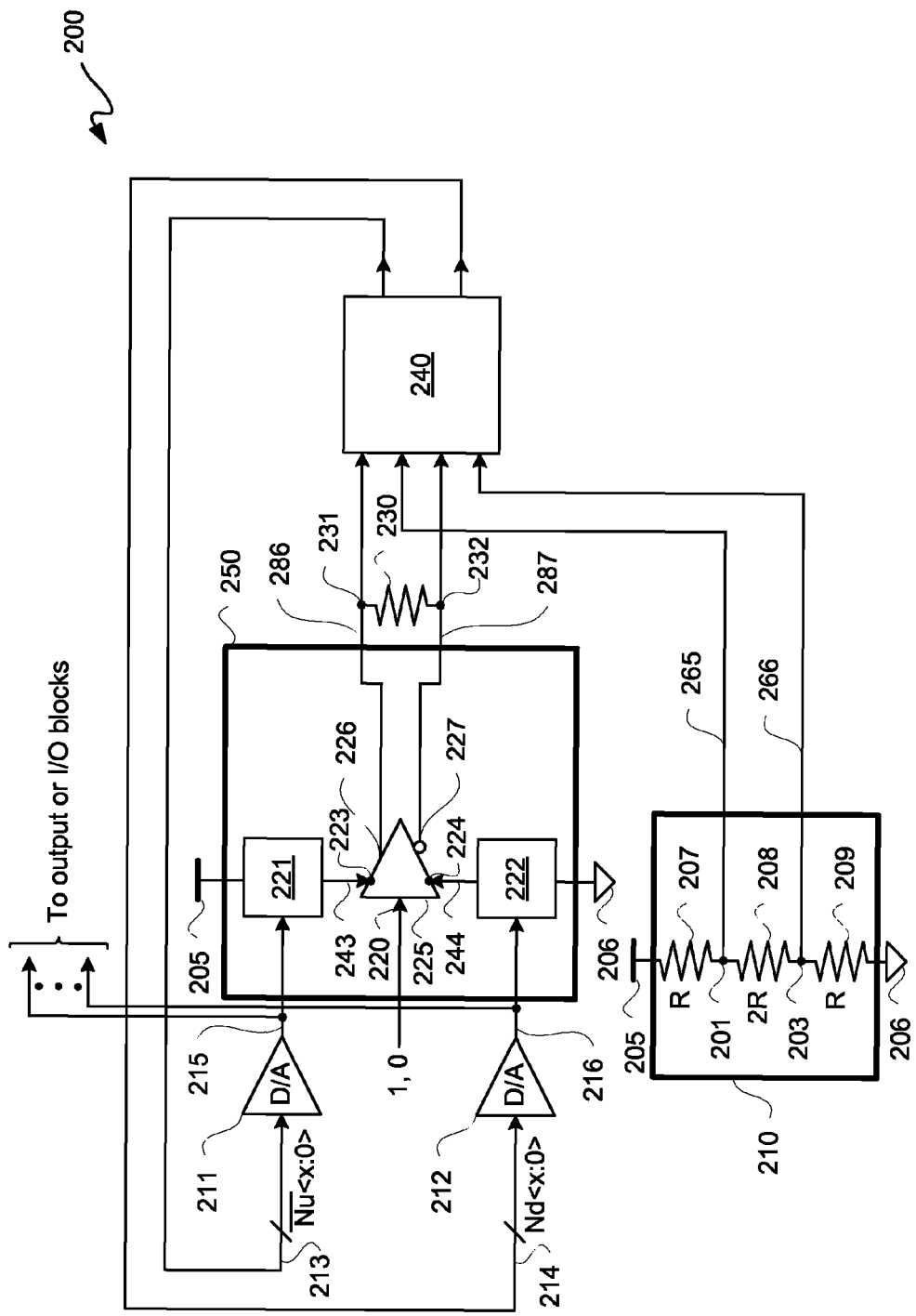
FIG. 2 is a block/circuit diagram depicting an exemplary embodiment of a source terminated device.

FIG. 2 is a block/circuit diagram depicting an exemplary embodiment of a source terminated device 200. Source terminated device 200 may be in FPGA 100 of FIG. 1 or another IC. Source terminated device 200 includes feedback control circuit 240, reference resistance circuit 210, impedance-voltage device 221, impedance-voltage device 222, differential driver circuit 225, digital-to-analog converter ("D/A") 211, and D/A 212.

Additionally, an external resistor 230 may be coupled between output pads 231 and 232 of source terminated device 200. Accordingly, external resistor 230 may not be part of source terminated device 200. In other embodiments, an internal resistor with respect to source terminated device 200 may be used. For purposes of clarity by way of example and not limitation, it shall be assumed that a 100 ohm resistance for external resistor 230 is used. However, in other embodiments other resistance values may be used. Furthermore, even though a differential output is described, the following description is likewise applicable to single-ended termination.

Low-power or high-speed data transmission may involve transmitters with Source-Series-Terminated ("SST") or Voltage Mode Line ("VML") drivers. Even though the following description is in terms of SST drivers, such description is likewise applicable to VML drivers and the like. Signal swing or return loss performance of SST and SST-like devices depends in part on matching transmission impedance. Impedance-voltage devices 221 and 222 may be used in combination with reference resistance circuit 210 to match or at least be substantially close to matching impedance of external resistor 230 even in view of process-voltage-temperature ("PVT") variation. External resistor 230 generally does not vary in resistance with respect to PVT variation. Voltage across external resistor 230 may be thought of as a function of pull-up and pull-down internal resistances of impedance-voltage devices 221 and 222, respectfully.

Differential driver circuit 225 has an input port 220, an output port 226, an output port 227, a bias node 223, and a bias node 224. Input port 220 may be coupled to receive either a logic 0 or 1 voltage level input. Impedance-voltage device 221 is coupled to provide bias voltage 243 to bias node 223. Impedance-voltage device 222 is coupled to provide bias voltage 244 to bias node 224. An analog voltage source, such as D/A 211, is coupled to provide analog voltage 215 to impedance-voltage device 221. Another analog voltage source, such as D/A 212, is coupled to provide analog voltage 216 to impedance-voltage device 222. In another embodiment, D/A 211 and 212 may be replaced with respective analog feedback circuits. However, for purposes of clarity by way of example and not limitation, it shall be assumed that analog voltage sources are provided using D/As 211 and 212.

Reference resistance circuit 210 has a resistor 207, a resistor 208, a resistor 209, a tap 201, and a tap 203. Resistances of resistors 207 and 209 are generally noted as each being of a value R, and resistance of resistor 208 is generally noted as being of a value 2R. Resistors 207, 208, and 209 may be external or internal with respect to an IC in which slice 250 is located. Resistor 207 is coupled between supply voltage bus 205 and tap 201. Resistor 208 is coupled between taps 201 and 203, and resistor 209 is coupled between tap 203 and ground bus 206. Accordingly, resistors 207 through 209 are coupled in series to provide a linear resistance ladder. A reference voltage 265 may be sourced from tap 201, and a reference voltage 266 may be sourced from tap 203. Such reference voltages 265 and 266 may vary with supply voltage variation. However, reference voltages 265 and 266 are generally constant over PT. However, a high reference voltage 265 and a low reference voltage 266 from reference resistance circuit 210 may be provided for any value of R, but higher values of R may save power.

Feedback control circuit 240 is coupled to output port 226, output port 227, tap 201, and tap 203. More particularly, output port 226 is coupled through output pad 231 to feedback control circuit 240, and output port 227 is coupled through output pad 232 to feedback control circuit 240. Feedback control circuit 240 is configured to provide a digital output 213 to D/A 211 and to provide a digital output 214 to D/A 212. Digital output 213 is in response to a relationship between voltages at output pad 231 and tap 201, namely output voltage 286 and reference voltage 265, respectively. Digital output 214 is in response to a relationship between voltages at output pad 232 and tap 203, namely output voltage 287 and reference voltage 266, respectively. For purposes of clarity by way of example and not limitation, each of digital outputs 213 and 214 may be x+1 bits long or wide, namely <x:0>.

Generally, digital output 213 indicates an amount of pull-up or a number of pull-up units ("Nu<x:0>") to be used, and digital output 214 indicates an amount of pull-down or a number of pull-down units ("Nd<x:0>") to be used. For a PMOS pull-up device, a smaller value for Nu<x:0> may translate to more pull-up voltage being applied to differential driver circuit 225, and thus digital output 213 may be thought of as Nu<x:0> bar, as indicated in FIG. 2.

Analog voltage 215 is provided as an input to impedance-voltage device 221. Impedance-voltage device 221 is coupled on a pull-up side of differential driver circuit 225 and is coupled to supply voltage bus 205. Analog voltage 216 is provided as input to impedance-voltage device 222. Impedance-voltage device 222 is coupled on a pull-down side of differential driver circuit 225 and is coupled to ground bus 206. Analog voltages 215 and 216 are respectively provided responsive to digital outputs 213 and 214, which are provided as inputs to D/As 211 and 212, respectively.

An IC, such as FPGA 100 of FIG. 1 for example, may have multiple driver circuits, such as multiple differential driver circuits. Differential driver circuit 225 may be a replica of one or more of such differential driver circuits of such an IC. Thus, for example, differential driver circuit 225 may be a replica of a single differential driver circuit, or may be a replica of eight differential driver circuits, or some other number of differential driver circuits. Thus, differential driver circuit 225 coupled for feedback control may be a reference differential driver circuit, which may be used to provide analog voltages 215 and 216 to other impedance-voltage device pairs of other differential driver circuits of other non-reference output blocks or input/output blocks of an IC for setting impedances thereof. Such other output blocks may not include feedback control circuit 240, D/A 211, D/A 212, and reference resistance circuit 210. Accordingly, source terminated device 200 may be used to adjust impedance or otherwise impedance tune multiple output blocks or multiple input/output blocks of an IC.

Differential driver circuit 225, impedance-voltage device 221, and impedance-voltage device 222 may all be part of a slice or stage 250 of a termination, such as an SST slice for example. Accordingly, a single slice or multiple slices may be used to collectively provide a reference source termination for impedance tuning, as described below in additional detail.

Figure 3:
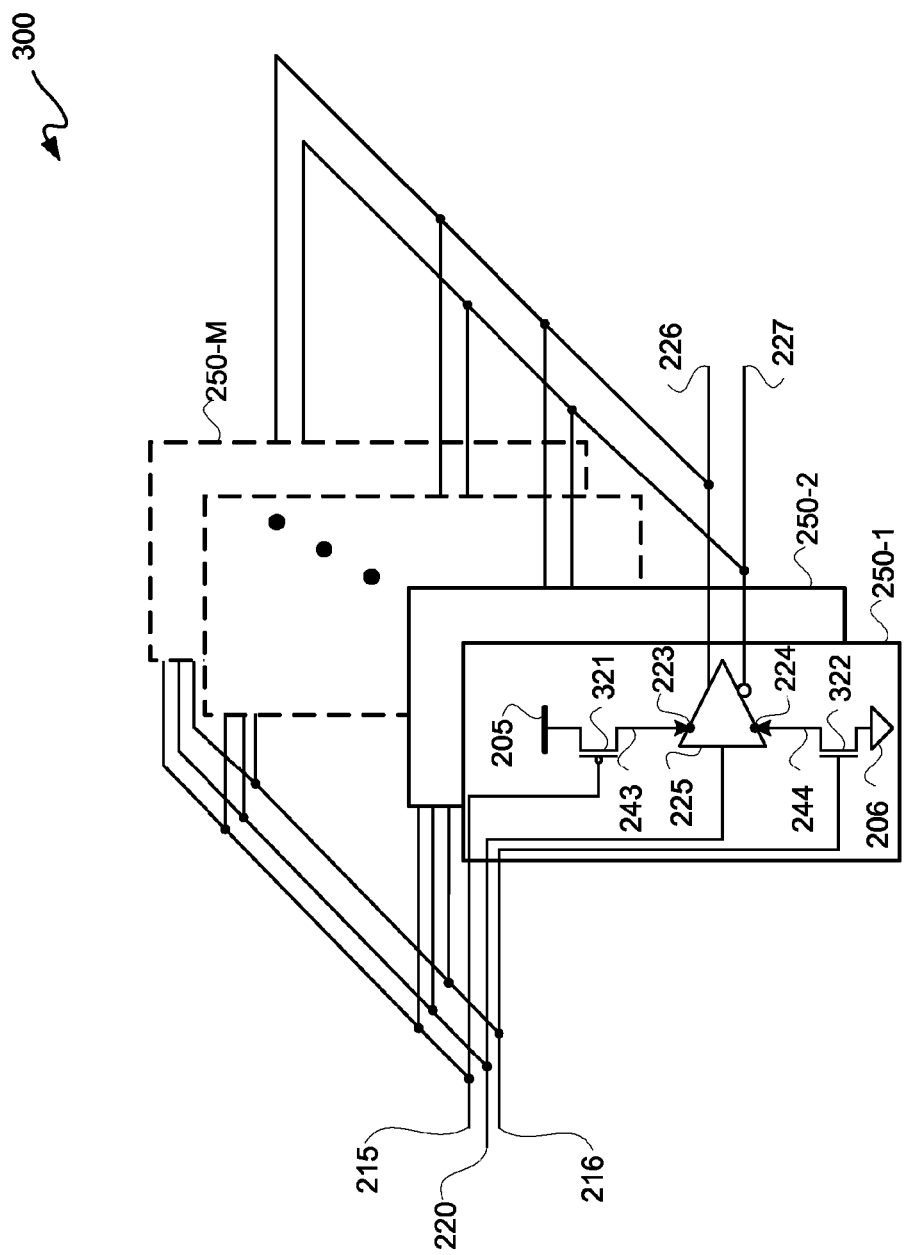
FIG. 3 is a block/circuit diagram depicting an exemplary embodiment of another source terminated device.

FIG. 3 is a block/circuit diagram depicting an exemplary embodiment of another source terminated device 300. Source terminated device 300 is similar to source terminated device 200 of FIG. 2, and thus generally only the differences are described for purposes of clarity. With simultaneous reference to FIGS. 2 and 3, source terminated device 300 is further described.

In this exemplary embodiment, there are M slices 250-1 through 250-M, for M a positive integer greater than zero (collectively slices 250). Output ports 226 of slices 250 are commonly connected, and output ports 227 of slices 250 are likewise commonly connected. Furthermore, each of slices 250 is coupled to receive analog voltage 215, analog voltage 216, and either a logic 0 or 1 as indicated by having a commonly connected input port 220. Accordingly, one or more slices 250 may be used for generating feedback control, such as in the form of digital outputs 213 and 214, in order to adjust impedance of one or more output drivers, where each of such output drivers may be implemented with one or more slices.

In this exemplary embodiment, in each slice 250, impedance-voltage device 221 is illustratively represented as a single PMOS transistor 321, and impedance-voltage device 222 is illustratively represented as a single NMOS transistor 322. Even though single instances of transistors 321 and 322 are illustratively depicted, each such single instance may represent one or more transistors of same type coupled in source drain parallel and commonly gated.

In each of slices 250, transistors 321 and 322 are respectively coupled to be gated with analog voltages 215 and 216. In each such slice, transistor 321 has a source node coupled to supply voltage bus 205 and a drain node coupled to a bias node 223 of differential driver circuit 225 for providing a bias voltage 243 thereto, and transistor 322 has a source node coupled to ground bus 206 and a drain node coupled to bias node 224 of differential driver circuit 225 for providing a bias voltage 244 thereto.

A transmitter driver may include one or more slices 250. One or more of slices 250 may be deactivated, such as tri-stated for example, as indicated by dashed lines. In an embodiment, slices 250 may be grouped into fixed number groupings to provide main cursor, post cursor and/or precursor slices, as described below in additional detail with reference to an FIR. However, in contrast to embodiments with a fixed number of slices, other embodiments may have a variable number of slices responsive to selective activation.

Transistors 321 and 322 may be operated into a linear or ohmic mode responsive to analog voltages 215 and 216. A conductive channel, such as conductive channels of transistors 321 and 322 for example, may have its channel resistance controlled by a gate voltage, such as analog voltages 215 and 216 for example. Thus, channel resistance may be increased, decreased, or maintained responsive to analog voltages 215 and 216. Digital outputs 213 and 214 may thus be separately adjusted by feedback control circuit 240 to respectively adjust impedances of impedance-voltage devices 221 and 222 responsive to analog voltages 215 and 216, respectively. Bias voltage 243 may be obtained from impedance-voltage device 321 responsive to a channel resistance thereof, where impedance-voltage device 321 is sourced from supply voltage 205. Bias voltage 244 may be obtained from impedance-voltage device 322 responsive to a channel resistance thereof, where impedance-voltage device 322 is sourced from a ground 206. Bias voltage 243 is provided to bias node 223 of differential driver circuit 225, and bias voltage 244 is provided to bias node 224 of differential driver circuit 225. An input voltage, such as for a logic 1 or logic 0, is provided to input port 220 of differential driver circuit 225.

Referring back to FIG. 2, a logic high or high output voltage 286 is output from output port 226 of differential driver circuit 225, and a logic low or low output voltage 287 is output from output port 227 of differential driver circuit 225. Reference voltage 265 and reference voltage 266 are generated with reference resistance circuit 210. Reference resistance circuit 210 has a tap 201 and a tap 202 for sourcing reference voltage 265 and reference voltage 266, respectively. Digital output 213 is generated by feedback control circuit 240 responsive to a first relationship between logic high voltage 286 and reference voltage 265, and digital output 214 is generated by feedback control circuit 240 responsive to a second relationship between logic low voltage 287 and reference voltage 266. Digital output 213 is adjusted by feedback control circuit 240 responsive to the first relationship to adjust impedance of impedance-voltage device 221 responsive to analog voltage 215, and digital output 214 is adjusted by feedback control circuit 240 responsive to the second relationship to adjust impedance of impedance-voltage device 222 responsive to analog voltage 216.

Figure 4:
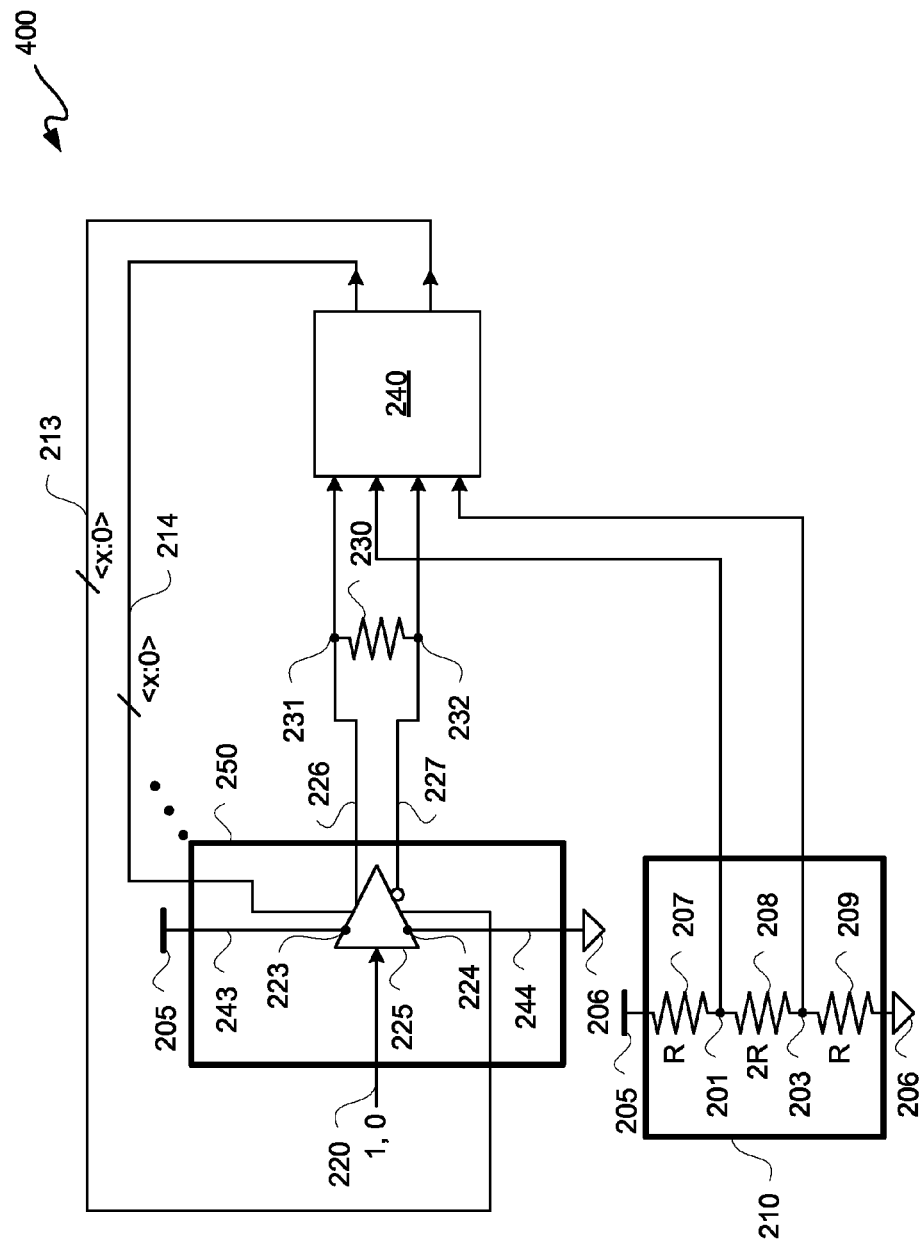
FIG. 4 is a block/circuit diagram depicting an exemplary embodiment of yet another source terminated device.

FIG. 4 is a block/circuit diagram depicting an exemplary embodiment of yet another source terminated device 400. Source terminated device 400 is the same as source terminated device 200 of FIG. 2, except for some differences which are described below in additional detail. Accordingly, for purposes of clarity and not dictation, description of same components is not repeated.

In this exemplary embodiment, bias node 223 is coupled to receive bias voltage 243 directly from supply voltage bus 205. Likewise, bias node 224 is coupled to receive bias voltage 244 directly from ground bus 206. Digital output 213 and digital output 214 are provided to directly select numbers of slices 250. Digital outputs 213 and 214 are for selecting numbers of slices of slices 250 to be used, as generally indicated by providing digital outputs 213 and 214 to pull-up and pull-down sides, respectively, of a differential driver circuit 225. In other words, a number of pull-up slices may be selected responsive to digital output 213, and a number of pull-down slices may be selected responsive to digital output 214. More examples of pull-up and pull-down slices are described below in additional detail. Furthermore, the number of pull-up slices may be equal to or different than the number of pull-down slices. Feedback control circuit 240 as described with reference to FIG. 7 may be used for providing digital outputs 213 and 214 to one or more slices 250 associated with source terminated device 400.

With reference to FIGS. 2 and 4, source terminated device 200 is for a fixed number of slices 250. In other words, impedance matching is provided by changing impedance of each slice in such fixed number of slices responsive to digital outputs 213 and 214 to change amplitude of analog voltages 215 and 216. However, source terminated device 400 is for a variable number of slices 250. In other words, impedance matching is provided by changing the number of pull-up and/or pull-down slices responsive to digital outputs 213 and 214.

Figure 5A:
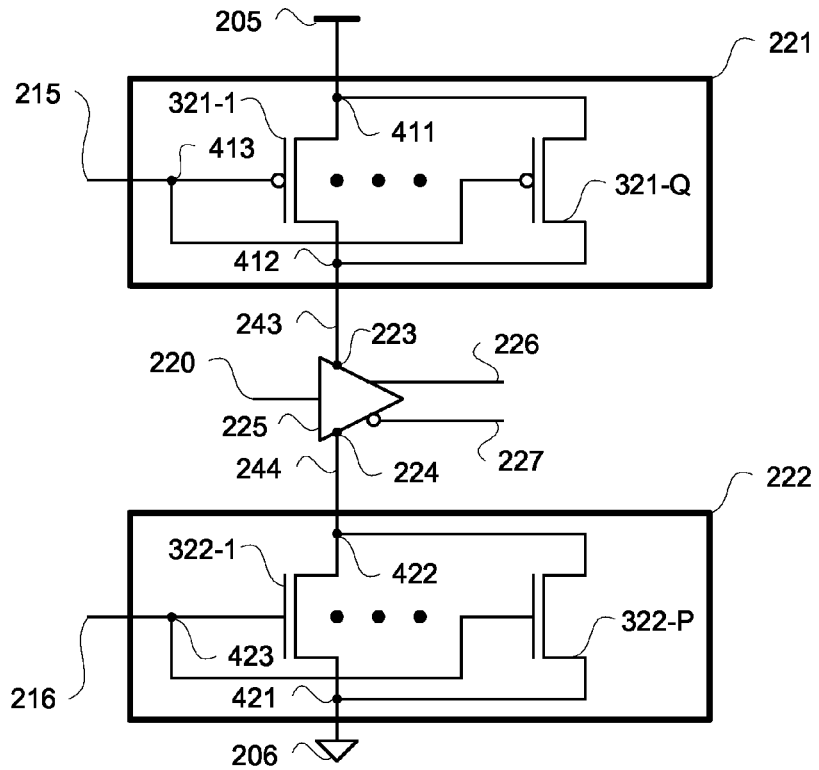
FIG. 5A is a circuit diagram depicting an exemplary embodiment of impedance-voltage devices.

FIG. 5A is a circuit diagram depicting an exemplary embodiment of impedance-voltage devices 221 and 222. In this exemplary embodiment, impedance-voltage device 221 is formed of PMOS transistors 321-1 through 321-Q, for Q a positive integer greater than or equal to one (collectively transistors 321). Source nodes 411 of transistors 321 are coupled to supply voltage bus 205. Drain nodes 412 of transistors 321 are coupled to bias node 223. Gate nodes 413 of transistors 321 are commonly gated to receive analog voltage 215.

Furthermore, in this exemplary embodiment, impedance-voltage device 222 is formed of NMOS transistors 322-1 through 322-P, for P a positive integer greater than or equal to one (collectively transistors 322). Source nodes 421 of transistors 322 are coupled to ground bus 206. Drain nodes 422 of transistors 322 are coupled to bias node 224. Gate nodes 423 of transistors 322 are commonly gated to receive analog voltage 216. Accordingly, source-drain parallel coupled transistors 321 collectively provide an internal pull-up resistance, and source-drain parallel coupled transistors 322 collectively provide an internal pull-down resistance.

Figure 5B:
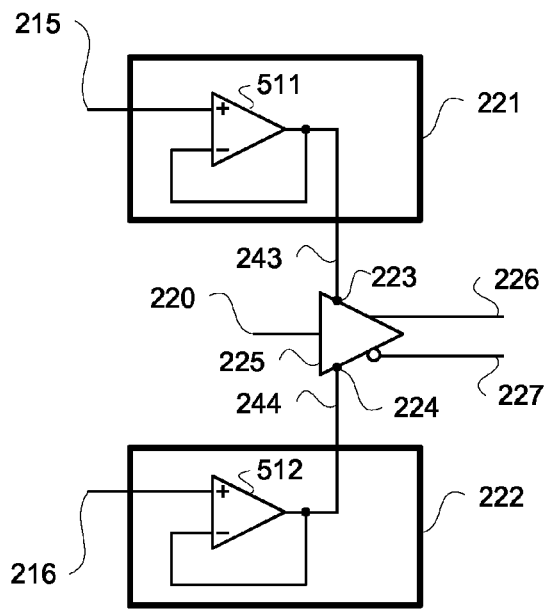
FIG. 5B is a circuit diagram depicting another exemplary embodiment of impedance-voltage devices.

FIG. 5B is a circuit diagram depicting another exemplary embodiment of impedance-voltage devices 221 and 222. In this exemplary embodiment, impedance-voltage devices 221 and 222 are respectively provided with amplifiers 511 and 512. More particularly, amplifiers 511 and 512 may be unity gain amplifiers.

In this exemplary embodiment of impedance-voltage device 221, analog voltage 215 may be provided to a positive input port of amplifier 511. Output of amplifier 511 may be provided to bias node 223 and may be provided as a feedback input to a minus port of amplifier 511.

In this exemplary embodiment of impedance-voltage device 222, analog voltage 216 may be provided to a positive input port of amplifier 512. Output of amplifier 512 may be provided to bias node 224 and may be provided as a feedback input to a minus port of amplifier 512. Generally, looking into the output of amplifiers 511 and 512, internal pull-up and pull-down impedances may be provided responsive to amplitude of analog voltages 215 and 216, respectively.

With simultaneous reference to FIGS. 5A and 5B, bias voltage 243 sourced from drain node 412 or output of amplifier 511 is a pull-up voltage or logic high bias voltage. Furthermore, bias voltage 244 sourced from drain node 422 or output of amplifier 512 is a pull-down voltage or logic low bias voltage. Values of bias voltages 243 and 244 affect output voltage swing across external resistor 230 and internal impedances of pull-up and pull-down paths of differential driver circuit 225.

Figure 6:
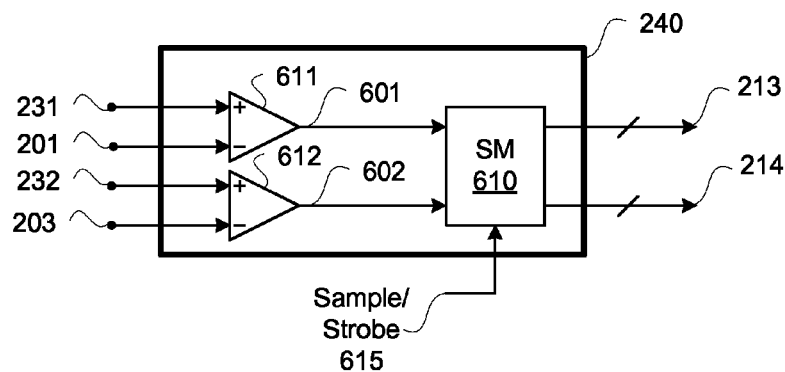
FIG. 6 is a block/circuit diagram depicting an exemplary embodiment of a feedback control circuit.

FIG. 6 is a block/circuit diagram depicting an exemplary embodiment of a feedback control circuit 240. Feedback control circuit 240 of FIG. 6 may be used for source terminated device 200 of FIG. 2. With simultaneous reference to FIGS. 2 and 6, feedback control circuit 240 of FIG. 6 is further described.

Feedback control circuit 240 includes a comparator 611, a comparator 612, and a state machine 610. Comparator 611 is coupled to output pad 231 and to tap 201. Output pad 231 is coupled to an output port 226. Comparator 612 is coupled to output pad 232 and to tap 203. Output pad 232 is coupled to an output port 227.

Comparator 611 receives high output voltage 286 to a plus input port and receives high reference voltage 265 to a minus input port. Output of comparator 611 is a logic high, such as a logic 1, for high output voltage 286 greater than high reference voltage 265. Output of comparator 611 is an up signal output 601. Up signal output 601 is provided as an input to state machine ("SM") 610. Output of comparator 611 is a logic low, such as a logic 0, for high output voltage 286 less than high reference voltage 265.

Comparator 612 receives low output voltage 287 to a plus input port and receives low reference voltage 266 to a minus input port. Output of comparator 612 is a logic high for low output voltage 287 greater than low reference voltage 266. Output of comparator 612 is a down signal output 602. Down signal output 602 is provided as an input to state machine 610. Output of comparator 612 is a logic low for low output voltage 287 less than low reference voltage 266.

State machine 610 is coupled to receive a sample or strobe signal 615 for sampling up signal output 601 and down signal output 602. State machine 610 is configured to provide digital output 213 responsive to a sampled value of up signal output 601. State machine 610 is further configured to provide digital output 214 responsive to a sampled value of down signal output 602.

Figure 7:
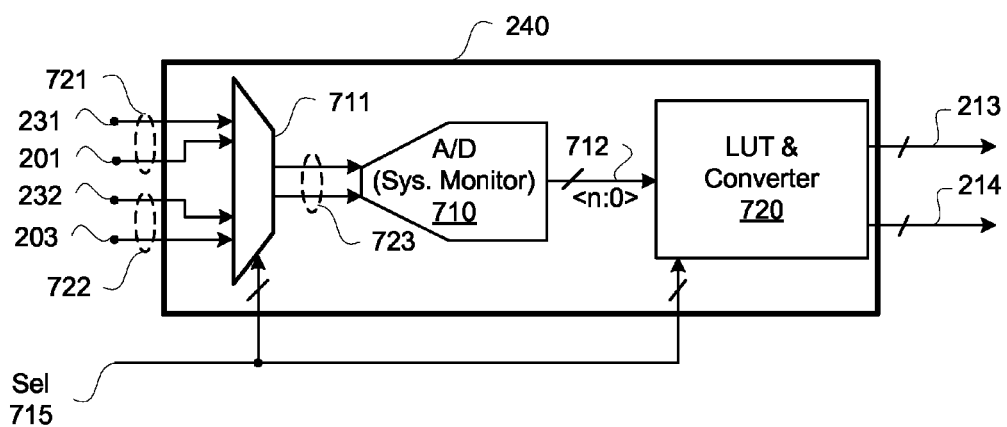
FIG. 7 is a block/circuit diagram depicting another exemplary embodiment of a feedback control circuit.

FIG. 7 is a block/circuit diagram depicting another exemplary embodiment of feedback control circuit 240. Feedback control circuit 240 of FIG. 7 may be used by source terminated device 400 of FIG. 4. With simultaneous reference to FIGS. 4 and 7, feedback control circuit 240 of FIG. 7 is further described.

Feedback control circuit 240 includes a multiplexer 711, an analog-to-digital converter ("ND") 710, and a lookup table and converter 720. Multiplexer 711 is coupled to output pads 231 and 232 and to taps 201 and 203. Again, output pads 231 and 232 are respectively coupled to output ports 226 and 227 for receiving output voltages 286 and 287, respectively. Multiplexer 711 is further coupled to receive control select signal 715. Control select signal 715 is used to select either pair of voltages 721 or pair of voltages 722 as a selected output pair of voltages 723. Pair of voltages 721 is output voltage 286 and reference voltage 265. Pair of voltages 722 is output voltage 287 and reference voltage 266.

Selected output pair of voltages 723 is provided as input to A/D 710. ND 710 may be of a system monitor of FPGA 100 of FIG. 1. A/D 710 converts such analog selected output pair of voltages 723 to a digital output 712, namely an n+1 wide or long digital output as generally indicated as <n:0> for n a positive integer greater than one. A system monitor of FPGA 100 of FIG. 1 may determine impedance values for a slice to provide code value for looking up a thermometer conversion value. Digital output 712 is provided as an input to lookup table ("LUT") and converter 720. Control select signal 715, or a portion thereof sufficient for indicating which pair of voltages is output from multiplexer 711, may be provided to lookup table and converter 720.

Lookup table and converter 720 may be configured to provide digital output 213 or digital output 214 responsive to digital output 712 and state of control select signal 715. More particularly, if control select signal 715 is in a state to select pair of voltages 721 as an analog selected output pair of voltages 723, then lookup table and converter 720 outputs digital output 213. If, however, control select signal 715 is in a state to select pair of voltages 722 as an analog selected output pair of voltages 723, then the lookup table and converter 720 outputs digital output 214. In another embodiment, multiplexer 711 may be omitted and another ND 710 may be added along with another lookup table and converter 720 for processing pairs of voltages 721 and 722 in parallel for providing digital outputs 213 and 214. Even though the term "lookup table and converter" is used for purposes of clarity to indicate both a lookup and a conversion, a populated lookup table is used for both functions. The population of conversion codes of such a lookup table is referred to as a conversion portion of lookup table and converter 720.

In this exemplary embodiment, a conversion portion of lookup table and converter 720 is a binary to thermometer code converter. However, in other embodiments, other types of codes may be used. Digital output 712 is effectively a digital or binary code as an analog-to-digital converter ("ADC") code, which is converted to a thermometer code by a conversion portion of lookup table and converter 720. A function embedded in such code in a lookup table portion of lookup table and converter 720 may be used to determine how many slices are to be used or asserted in a driver to match or at least approximately match pull-up and pull-down resistances of resistors 207 and 209, respectively. Accordingly digital outputs 213 and 214 may be used to indicate the number of pull-up units or slices and pull-down units or slices, respectively, to be selected for matching such resistances.

Figure 8:
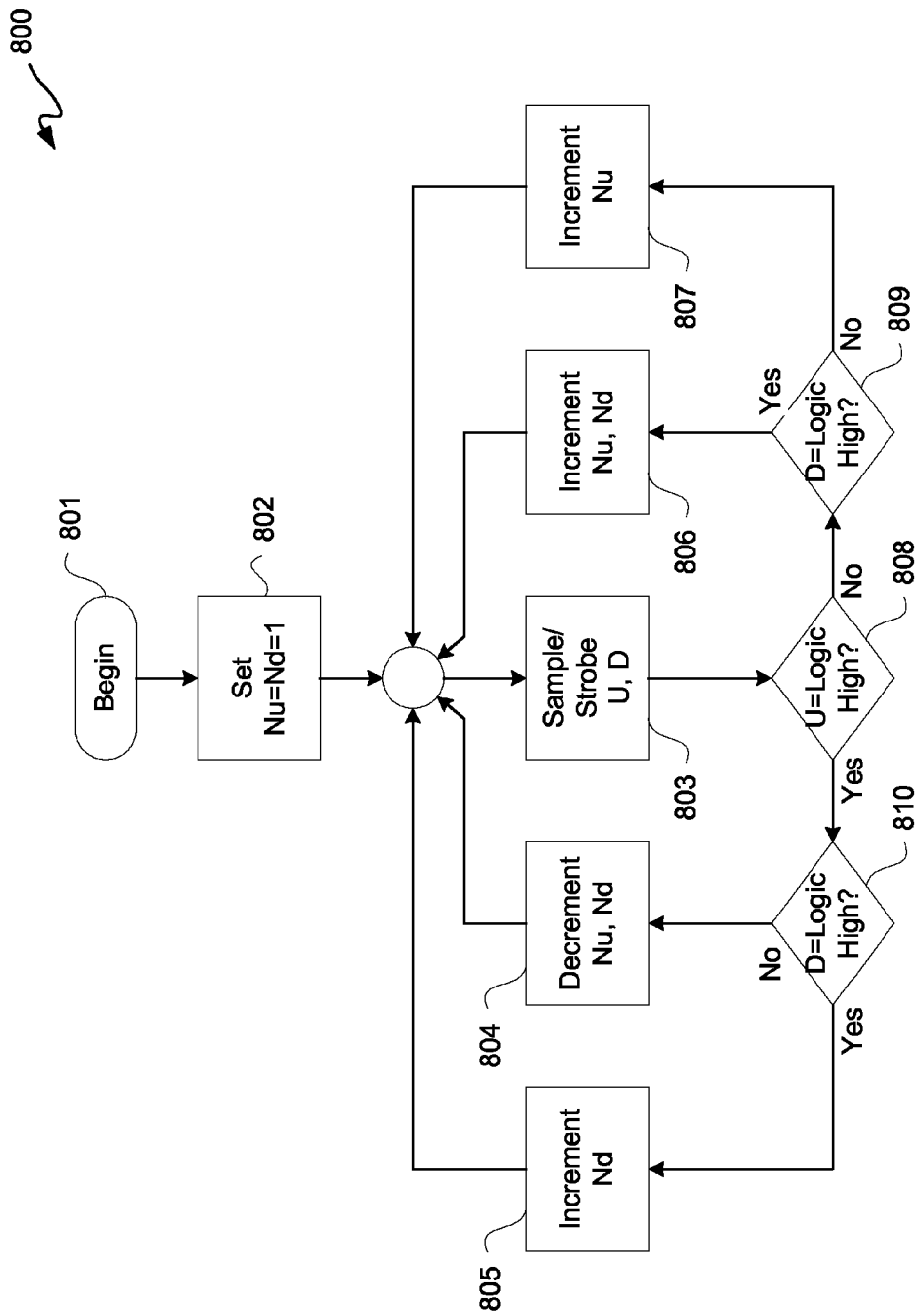
FIG. 8 is a flow diagram depicting an exemplary embodiment of a state machine flow.

FIG. 8 is a flow diagram depicting an exemplary embodiment of a state machine flow 800. State machine flow 800 is a flow for state machine 610 of FIG. 6 for feedback control circuit 240 of source terminated device 200 of FIG. 2. State machine flow 800 is initiated 801.

Figure 21:
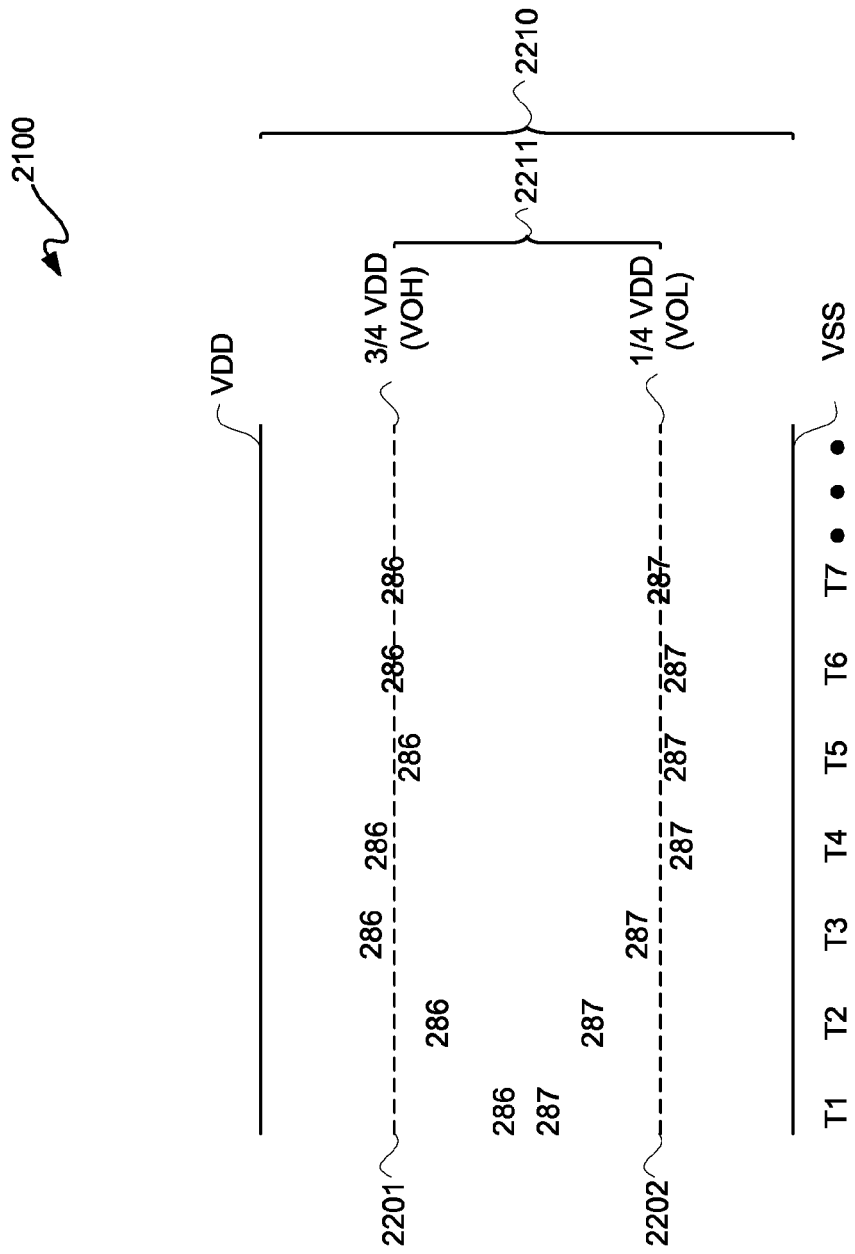
FIG. 21 is a timeline diagram depicting an exemplary embodiment of an output voltage adjustment flow.

FIG. 21 is a timeline diagram depicting an exemplary embodiment of an output voltage adjustment flow 2100. For output voltage adjustment flow 2100, a voltage output high ("VOH") level 2201 is set at 75% of VDD or ¾ VDD, and a voltage output low ("VOL") level 2202 is set at 25% of VDD or ¼ VDD. These are just example target level voltages, and these or other target level voltages may be used in other embodiments. In this exemplary embodiment, a rail-to-rail voltage 2210 is from VSS to VDD, and an output voltage swing 2211 is from VOL level 2202 to VOH level 2201. State machine flow 800 is further described with simultaneous reference to FIGS. 2, 6, 8, and 21.

At 802, a number or value for pull-up units ("Nu") and a number or value for pull-down units ("Nd") are both set equal to 1. The number of pull-up units is effectively digital output 213, and the number of pull-down units is effectively digital output 214. At time T1, both high output voltage 286 and low output voltage 287 may be somewhere between levels 2202 and 2201, responsive to such setting at 802. At 803, up signal output 601 and down signal output 602 are strobed or sampled. State machine 610 is coupled to receive a sample or strobe signal 615 for sampling up signal output 601 and down signal output 602.

At 808, it may be determined whether one of such signal outputs 601 or 602 is equal to a logic high, namely equal to logic 1. For purposes of clarity by way of example not limitation, it is determined at 808 whether up signal output ("U") 601 is equal to a logic 1, which condition being true would indicate that high output voltage 286 at output pad 231 is greater than VOH level 2201. If, at 808, it is determined that up signal output 601 is not equal to logic 1, which condition indicates that high output voltage 286 is less than VOH level 2201, then at 809 it is determined whether down signal output ("D") 602 is equal to a logic high, which condition being true would indicate that low output voltage 287 at output pad 232 is greater than VOL level 2202. If, at 809, it is determined that down signal output 602 is equal to logic 1, which condition indicates that low output voltage 287 is greater than VOL level 2202, then at 806 both of Nd and Nu are incremented. Such incrementing of Nd and Nu respectively causes low output voltage 287 to move down in a direction towards VOL level 2202 and causes high output voltage 286 to move up in a direction towards VOH level 2201, as generally indicated at time T2. Such movement in a direction may result in passing a target level, such as either or both VOL level 2202 and VOH level 2201.

Table I below is a logic table for Nu and Nd responsive to states of up signal output 601 and down signal output 602. Table I may be borne in mind in view of state machine flow 800.

TABLE I

| Up Signal Output 601 | Down Signal Output 602 | Nu | Nd |
|---|---|---|---|
| 0 | 0 | Increment | No Change |
| 0 | 1 | Increment | Increment |
| 1 | 0 | Decrement | Decrement |
| 1 | 1 | No Change | Increment |

After repeating operations as previously described for incrementing both Nu and Nd, high output voltage 286 is greater than VOH level 2201, and low output voltage 287 is greater than VOL level 2202. This condition is indicated at time T3.

After incrementing again at 806 for example as previously described resulting in the condition at time T3, sampling at 803 is repeated. After such repeated sampling at 803, it is determined at 808 whether up signal output 601 is equal to logic 1. If, at 808, it is determined that up signal output 601 is equal to logic 1, then at 810 is determined whether down signal output 602 is equal to logic 1. If, at 810 it is determined that down signal output 602 is equal to logic 1, which condition indicates that low output voltage 287 is greater than VOL level 2202, then at 805 Nd is incremented and sampling repeats at 803. After incrementing at 805, low output voltage 287 decreases in response to such incrementing. This condition is indicated at time T4.

Again, sampling at 803 is repeated, and it is again determined at 808 whether up signal output 601 is equal to logic 1. If, at 808, it is determined that up signal output 601 is equal to logic 1, then at 810 it is again determined whether down signal output 602 is equal to logic 1. If, at 810 it is determined that down signal output 602 is not equal to logic 1, which condition indicates that low output voltage 287 is less than VOL level 2202, then at 804 both of Nd and Nu are decremented. Such decrementing of Nd and Nu respectively causes low output voltage 287 to move up in a direction towards VOL level 2202 and causes high output voltage 286 to move down in a direction towards VOH level 2201. After decrementing at 804, high output voltage 286 decreases and low output voltage 287 increases in response to such decrementing. This condition is indicated at time T5.

Sampling at 803 is yet again repeated, and it is yet again determined at 808 whether up signal output 601 is equal to logic 1. If, at 808, it is determined that up signal output 601 is not equal to logic 1, then at 809 is determined whether down signal output 602 is equal to logic 1. If, at 809 it is determined that down signal output 602 is not equal to logic 1, which condition indicates that low output voltage 287 is less than VOL level 2202, then at 807 Nu is incremented. After incrementing at 807, high output voltage 286 increases in response to such incrementing. This condition is indicated at time T6.

Sampling at 803 may again be repeated until target voltages for VOH level 2201 and VOL level 2202 are attained. As generally indicated for time T7 onward, high output voltage 286 and low output voltage 287 generally settle at, or may toggle just above and below, VOH level 2201 and VOL level 2202, respectively.

Figure 9:
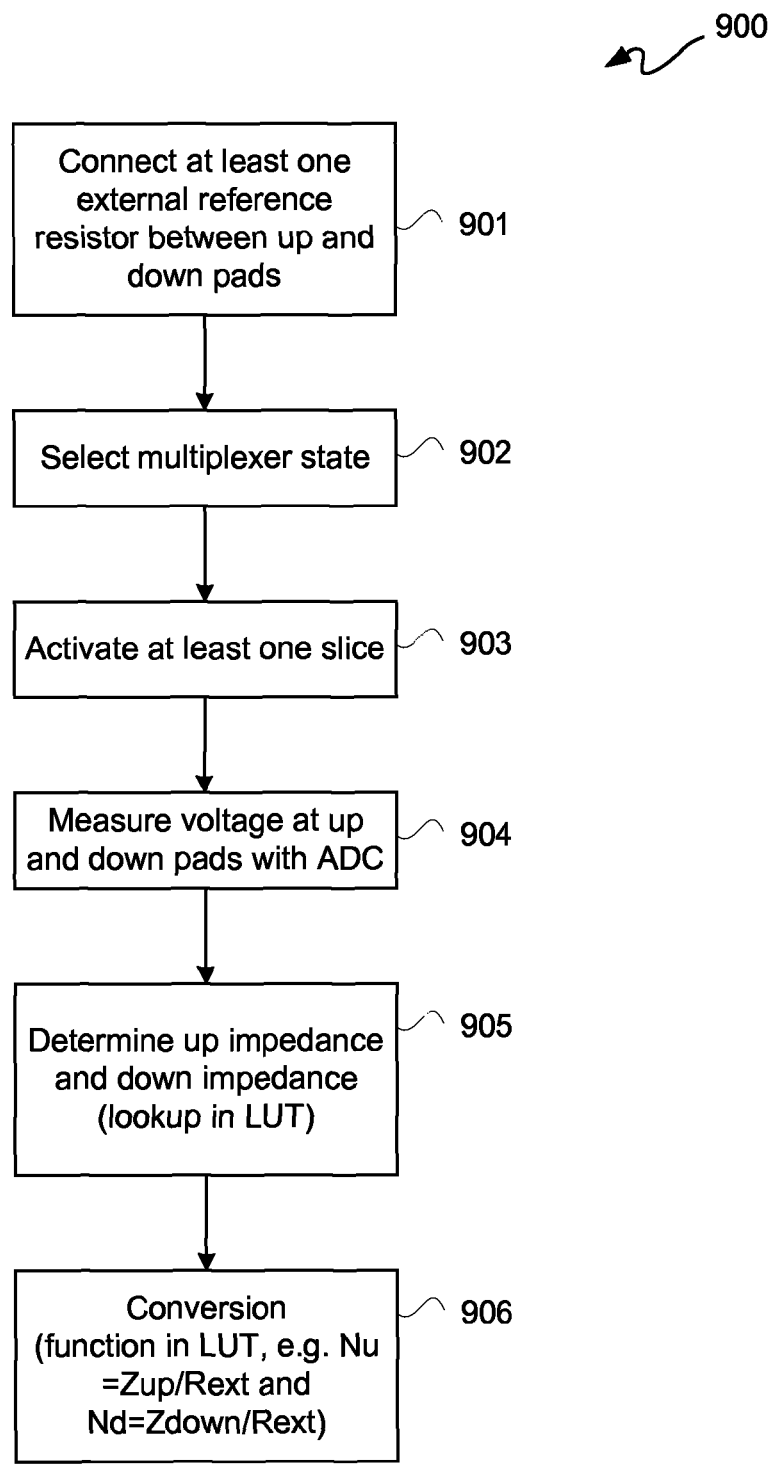
FIG. 9 is a flow diagram depicting an exemplary embodiment of a number of slices determination flow.

FIG. 9 is a flow diagram depicting an exemplary embodiment of a number of slices determination flow 900. Slice determination flow 900 may be used with feedback control circuit 240 of FIG. 7 of source terminated device 400 of FIG. 4. Slice determination flow 900 is described in further detail simultaneous reference to FIGS. 4, 7, and 9.

At 901, at least one external reference resistor, such as external resistor 230, is connected between up and down output pads, such as output pads 231 and 232. At 902, a multiplexer state is selected. Such state may be selected by control select signal 715 applied to multiplexer 711.

At 903, at least one slice, such as a slice 250, is activated for measurement thereof. At 904, voltages at up and down output pads of such slice activated at 903 are provided to an ADC. Again, as previously described, ND 710 may be used to measure or otherwise determine voltages. At 905, impedances for slice pull-up ("Zup") and slice pull-down ("Zdown") are determined. As previously described, such determination may be a lookup in LUT, such as accessing a LUT of lookup table and converter 720 responsive to a binary output obtained at 904. Again, as previously described output of ND 710 may be converted to a thermometer code.

At 906, impedances determined at 905 are converted into numbers of slices, and at 906 such slices may be activated. For example, such conversion may be a function embedded in a LUT of lookup table and converter 720 to provide a conversion portion thereof. For purposes of clarity by way of example and not limitation, a number of pull-up slices, Nu, may be set equal to a floor level of slices that is a function of Zup, such as Nu=floor(Zup/50 Ohm). Likewise, for purposes of clarity by way of example not limitation, a number of pull-down slices, Nd, may be set equal to a floor level of slices that is a function of Zdown, such as Nd=floor(Zdown/50 Ohm). In this example, a lookup is used to determine how many slices are to be activated in a driver to match 50 ohms of each of pull-up and pull-down resistors, namely resistors 207 and 209, respectively. Even though the example of 50 ohms each is used for resistors 207 and 209, other values may be used. In addition, values substantially larger than 50 ohms, such as 1K ohms or other resistance value for example, may be used as previously described.

Accordingly, with slices determination flow 900, impedance, Z, of each type of slice, such as a pull-up slice and/or a pull-down slice, may be determined for determining a number of pull-up slices and a number pull-down slices for activation. The number of pull-up slices and the number of pull-down slices may be the same or different. Slice determination flow 900 may be periodically executed to capture variation due to changes in temperature and/or voltage.

Figure 10:
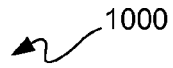
FIG. 10 is a table diagram depicting an exemplary embodiment of a post cursor setting as a function of a number of slices.

FIG. 10 is a table diagram depicting an exemplary embodiment of a post cursor setting as a function of a number of slices, N, as indicated in Table 1000. For a total number of slices, N, such slices may be assigned as either main cursor units or post cursor units. As indicated in Table 1000, post cursor decibels may be determined as a logarithmic function of the number of main cursor units divided by the total number of slices. Table 1000 may be used for an embodiment where slice impedance is controlled by D/As, such as for example source terminated device 200 of FIG. 2. Table 1000 is for a fixed total number of slices, where impedance of individual slices is changed for impedance matching, namely responsive to analog voltages 215 and 216 of FIG. 2. Thus, the number of active slices is not changed for such impedance matching, as described with respect to other embodiments herein.

Figure 11:
FIG. 11 is a table diagram depicting an exemplary embodiment of a precursor setting as a function of a number of slices.

FIG. 11 is a table diagram depicting an exemplary embodiment of a precursor setting as a function of a number of slices, N, as indicated in Table 1100. For a total number of slices, N, such slices may be assigned as either main cursor units or precursor units. As indicated in Table 1100, precursor decibels may be determined as a logarithmic function of the number of main cursor units divided by the total number of slices. Table 1100 may be used for an embodiment where slice impedance is controlled by D/As, such as for example source terminated device 200 of FIG. 2. Table 1100 is for a fixed total number of slices, where impedance of individual slices is changed for impedance matching, namely responsive to analog voltages 215 and 216 of FIG. 2. Thus, the number of active slices is not changed for such impedance matching, as described with respect to other embodiments herein.

An embodiment with a fixed number of slices is described below with respect to an FIR. However, In Table 1000, determination of post cursor decibels works only for having the possibility of main and post cursor units. Likewise, in Table 1100, determination of precursor decibels works only for having the possibility of main and precursor units. However, in other embodiments, such as the one described below for an FIR, main, post cursor, and precursor units may be used, as described below in additional detail.

Figure 12:
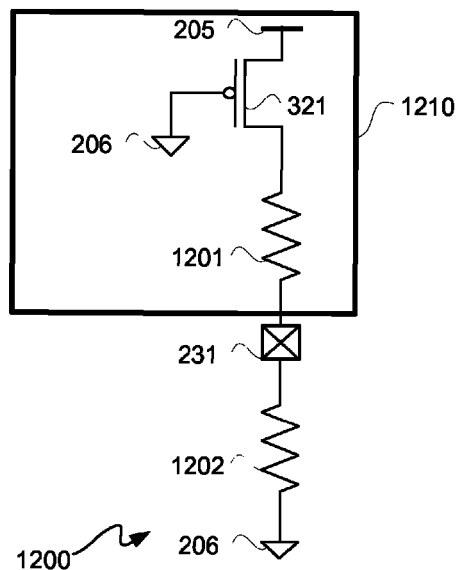
FIGS. 12 through 20 are circuit diagrams depicting exemplary embodiments of termination circuits.
Figure 13:
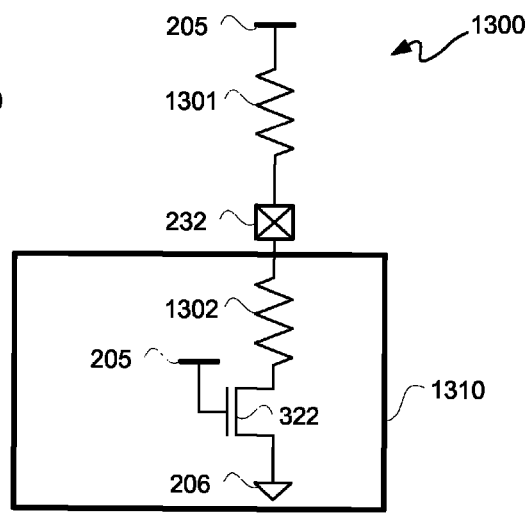

FIGS. 12 and 13 are circuit diagrams depicting exemplary embodiments of termination circuits 1200 and 1300, respectively. Termination circuits 1200 and 1300 in combination provide a unit or slice topology, such as for a slice 250 of source terminated device 400 of FIG. 4. For more stable internal driver resistance, a replica of a driver may be compared with an external linear resistor.

For a pull-up termination circuit 1200, an external resistor 1202 is coupled between pull-up output pad 231 and ground bus 206. A single replica unit or slice 1210 of a driver is coupled to output pad 231. By single replica unit, it is meant a replica driver having a number of slices greater than one. Such single replica unit or slice 1210 may have an internal pull-up resistance modeled as a resistor 1201 coupled between a drain node of a PMOS transistor 321 and pull-up output pad 231, where PMOS transistor 321 is gated to ground bus 206 and sourced to supply voltage bus 205 for source terminated device 400 of FIG. 4. For pull-down termination circuit 1300, an external resistor 1301 is coupled between pull-down output pad 232 and supply voltage bus 205. A single replica unit or slice 1310 may have an internal pull-down resistance modeled as a resistor 1302 coupled between a drain node of NMOS transistor 322 and pull-down output pad 232, where NMOS transistor 322 is gated to supply voltage bus 205 and sourced to ground bus 206 for source terminated device 400 of FIG. 4.

For an embodiment, internal resistance of a single replica unit or slice 1210 may be a unitary pull-up internal resistance, and internal resistance of a single replica unit or slice 1310 may be a unitary pull-down internal resistance. Thus, as previously described with reference to source terminated device 400 of FIG. 4, a number of pull-up slices 1210 and a number of pull-down slices 1310 of slices 250 may be activated for impedance matching. Again, the number of pull-up slices 1210 activated and the number of pull-down slices 1310 activated may or may not be equal. In such an embodiment, external resistance of external resistor 1202 may for example be equal to approximately 3 times a nominal resistance of a single replica unit or slice 1210, and external resistance of external resistor 1301 may for example be equal to approximately 3 times a nominal resistance of a single replica unit or slice 1310. Voltages at pull-up output pad 231 and pull-down output pad 232 are functions of internal pull-up and pull-down resistances of single replica unit or slice 1210 and 1310, respectively. Thus for purposes of clarity by way of example and not limitation, if a pull-up pad voltage level or VOH was targeted at 75% of VDD and a pull-down pad voltage level or VOL was targeted at 25% of VDD, then for a driver nominally having 40 units or slices, internal resistance of a unit or slice may be 40 multiplied by 50 ohms, or 2K ohms, and external resistance of an external resistor may be 6K ohms.

Figure 14:
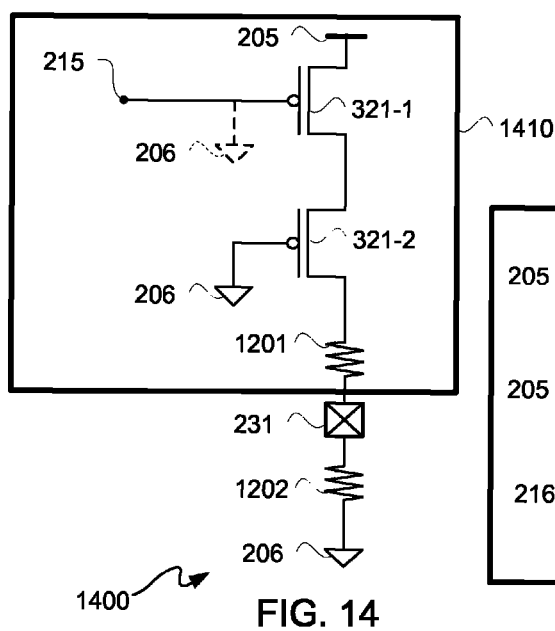
Figure 15:
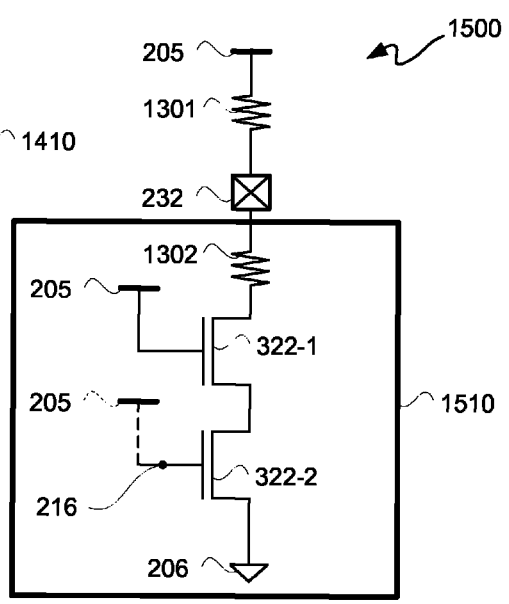

FIGS. 14 and 15 are circuit diagrams depicting exemplary embodiments of termination circuits 1400 and 1500, respectively. Termination circuits 1400 and 1500 in combination provide a unit or slice topology. Unit or slice 1410 is the same as unit or slice 1210 of FIG. 12, except with two PMOS transistors 321-1 and 321-2 coupled in source-drain series, where PMOS transistor 321-1 is gated either to analog voltage 215 or ground bus 206. In an embodiment, PMOS transistor 321-1 is gated with analog voltage 215, and thus may be used as a slice 250 of source terminated device 200 of FIG. 2. In another embodiment, PMOS transistor 321-1 is gated by ground bus 206, and thus may be used as a pull-up slice of slices 250 of source terminated device 400 of FIG. 4. PMOS transistor 321-2 is generally the same as PMOS transistor 321 of FIG. 12, and accordingly, repeat description is not provided for purposes of clarity.

Unit or slice 1510 is the same as unit or slice 1310 of FIG. 13, except with two NMOS transistors 322-1 and 322-2 coupled in source drain series, where NMOS transistor 321-1 is gated either to analog voltage 216 or supply voltage bus 205. In an embodiment, NMOS transistor 322-2 is gated with analog voltage 216, and thus may be used as a slice 250 of source terminated device 200 of FIG. 2. In another embodiment, NMOS transistor 322-2 is gated by supply voltage bus 205, and thus may be used as a pull-down slice of slices 250 of source terminated device 400 of FIG. 4. NMOS transistor 322-1 is generally the same as NMOS transistor 322 of FIG. 12, and accordingly, repeat description is not provided for purposes of clarity.

Figure 16:
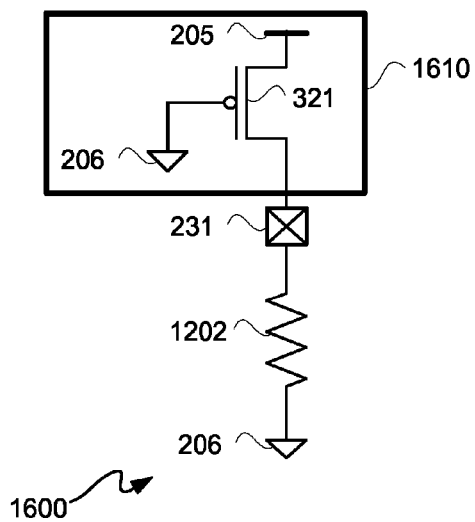
Figure 17:
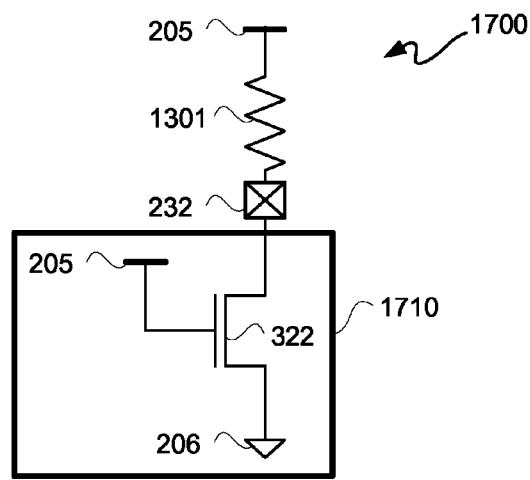

FIGS. 16 and 17 are circuit diagrams depicting exemplary embodiments of termination circuits 1600 and 1700, respectively. Termination circuits 1600 and 1700 in combination provide a unit or slice topology, such as associated with a slice 250 of source terminated device 400 of FIG. 4. Unit or slice 1610 is the same as unit or slice 1210 of FIG. 12, except without resistor 1201, where a drain node of PMOS transistor 321 is connected to pull-up output pad 231. Unit or slice 1710 is the same as unit or slice 1310 of FIG. 13, except without resistor 1302, where a drain node of NMOS transistor 322 is connected to pull-down output pad 232. Accordingly, repeat description is not provided for purposes of clarity.

Figure 18:
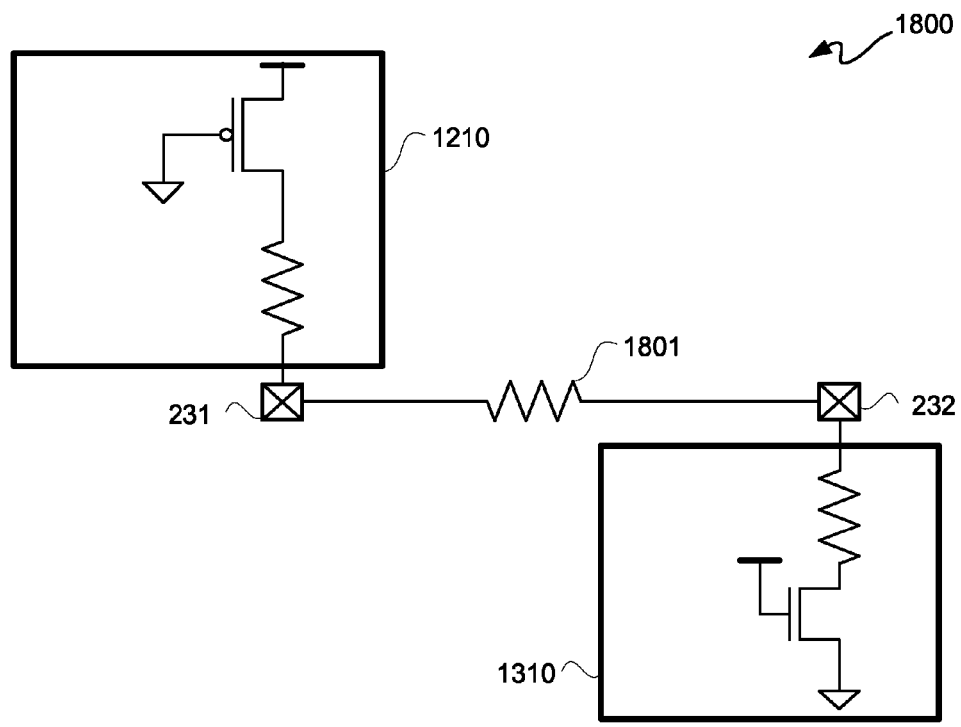
Figure 19:
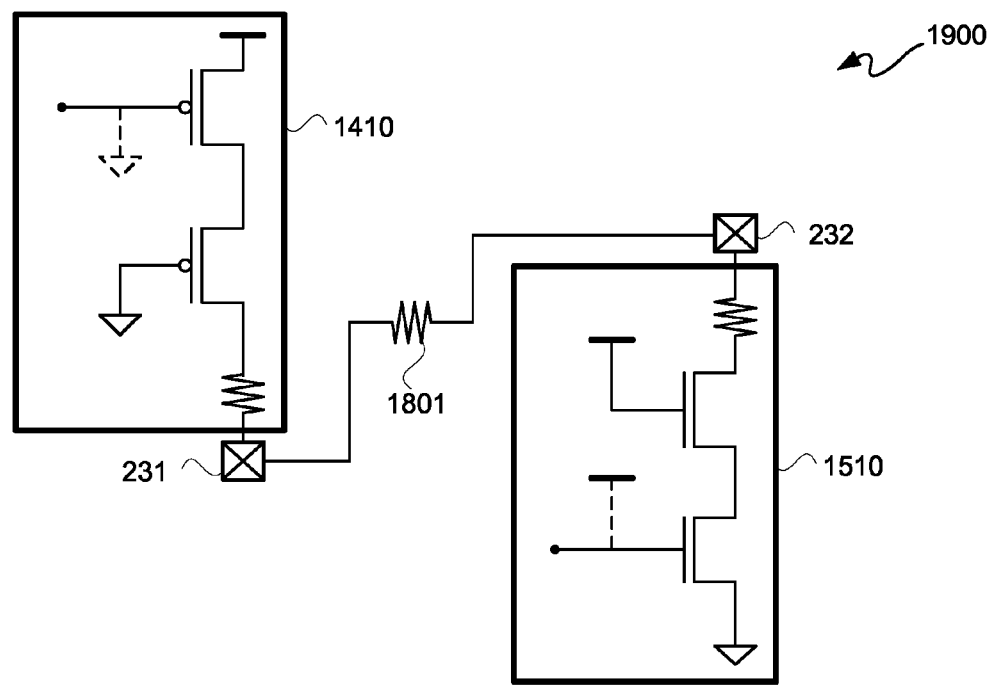
Figure 20:
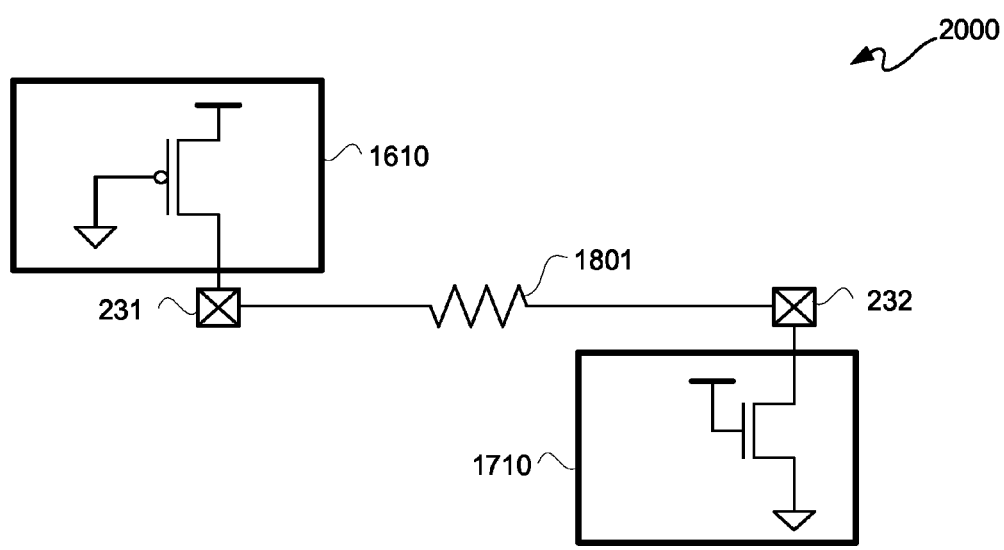

FIGS. 18, 19, and 20 are circuit diagrams depicting respective exemplary embodiments of termination circuits for a single replica unit or slice. Termination circuit 1800 may be for source terminated device 400 of FIG. 4. For termination circuit 1800, a single replica unit or slice 1210 is coupled to a single replica unit or slice 1310 via a series of pull-up output pad 231, external resistor 1801, and pull-down output pad 232. In this exemplary embodiment, external resistor 1801 may be approximately equal to twice the internal resistance of a single replica unit or slice 1210 or 1310. For purposes of clarity and not limitation, it is assumed that internal resistance of single replica unit or slice 1210 generally equals that of single replica unit or slice 1310.

Termination circuit 1900 may be for slices of either source terminated device 400 of FIG. 4 or source terminated device 200 of FIG. 2, as previously described with reference to FIGS. 14 and 15. More particularly, termination circuit 1900 is the same as termination circuit 1800, except that single replica units or slices 1210 and 1310 are respectively replaced with single replica units or slices 1410 and 1510.

Termination circuit 2000 may be for slices of source terminated device 400 of FIG. 4. Termination circuit 2000 is the same as termination circuit 1800, except that single replica units or slices 1210 and 1310 are respectively replaced with single replica units or slices 1610 and 1710.

Figure 22:
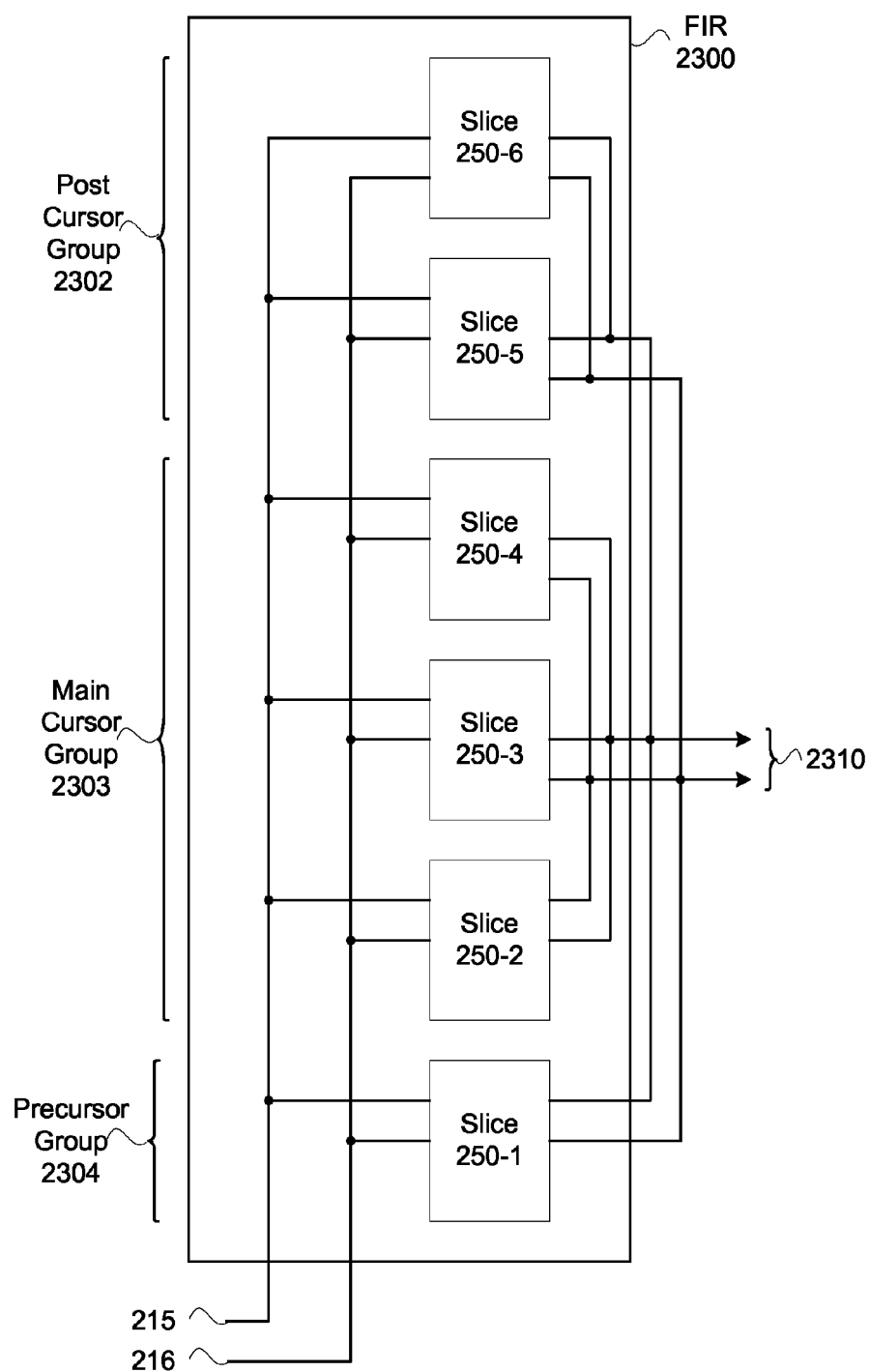
FIG. 22 is a block diagram depicting an exemplary embodiment of a finite impulse response ("FIR") filter.

FIG. 22 is a block diagram depicting an exemplary embodiment of a finite impulse response ("FIR") filter 2300. FIR filter 2300 includes slices 250-1 through 250-N, for N a positive number greater than three (collectively slices 250). In this exemplary embodiment, N is equal to six; however, in other embodiments fewer or more than six slices 250 may be used. Impedance of FIR filter 2300 may be adjusted by adjusting the impedance of slices 250.

FIR filter 2300 has a fixed number of slices. The number of slices for driver units does not have to change to accommodate for PVT variations, as the impedance of slices 250 may be adjusted. This allows allocation of precursor and post cursor functionality to be more straightforward. Heretofore, use of precursor and post cursor settings involve a less straightforward calibration because internal output impedance and precursor/post cursor boost settings are not necessarily mutually exclusive.

In this exemplary embodiment, slice 250-1 is for a precursor group 2304. A differential output is provided from slice 250-1. Slices 250-2 through 250-4 are for a main cursor group 2303. Slices 250-2 through 250-4 have differential outputs which are commonly coupled respectively for a pull-up output and a pull-down output. Slices 250-5 and 250-6 are for a post cursor group 2302. Slices 250-5 and 250-6 have differential outputs which are commonly coupled respectively for a pull-up output and a pull-down output. Either or both precursor group 2304 or post cursor group 2302 may be used with main cursor group 2303. Accordingly, allocation of slices 250 may be for two or more of groups 2302 through 2304, where main cursor group 2303 has one or more slices in any such allocation. Outputs of groups 2302 through 2304 may be commonly coupled, with all high outputs coupled together and all low outputs coupled together, to provide a single differential output 2310.

Each of slices 250-1 through 250-6 is coupled to receive analog voltage 215 and analog voltage 216, as previously described. Accordingly, responsive to analog voltage 215 and analog voltage 216, impedance of slices 250 may be adjusted without having to change the number of slices in FIR filter 2300. This is to be contrasted where, as previously described, the number of slices in a driver was changed while keeping impedance of a single slice the same. However, in this embodiment, impedance of FIR filter 2300 may be adjusted to match transmission impedance, such as impedance of external resistor 1801 for example. Thus impedance of each of slices 250 may be adjusted to provide impedance of FIR filter 2300 in order to match such transmission impedance.

While the foregoing describes exemplary embodiments in accordance with one or more aspects of the invention, other and further embodiments in accordance with the one or more aspects of the invention may be devised without departing from the scope thereof, which is determined by the claims that follow and equivalents thereof. Claims listing steps do not imply any order of the steps. Trademarks are the property of their respective owners.

What is claimed is:

1. An apparatus for impedance adjustment, comprising:
a differential driver circuit having an input port, a first output port, a second output port, a first bias node, and a second bias node;
a first analog voltage source
a second analog voltage source;
a reference resistance circuit having a first tap and a second tap;
a feedback control circuit coupled to the first output port, the second output port, the first tap, and the second tap;
wherein the feedback control circuit is configured to provide a first digital output to the first analog voltage source in response to a first relationship between first voltages at the first output port and the first tap; and
wherein the feedback control circuit is further configured to provide a second digital output to the second analog voltage source in response to a second relationship between second voltages at the second output port and the second tap.

2. The apparatus according to claim 1, further comprising:
a first impedance-voltage device coupled to provide a first bias voltage to the first bias node; and
a second impedance-voltage device coupled to provide a second bias voltage to the second bias node;
wherein the first analog voltage source is coupled to provide a first analog voltage to the first impedance-voltage device; and
wherein the second analog voltage source is coupled to provide a second analog voltage to the second impedance-voltage device.

3. The apparatus according to claim 2, wherein:
the first analog voltage source is a first digital-to-analog converter coupled to receive the first digital output for providing the first analog voltage in response to the first digital output;
the second analog voltage source is a second digital-to-analog converter coupled to receive the second digital output for providing the second analog voltage in response to the second digital output;
the reference resistance circuit is a linear resistance ladder; and
a resistor is externally coupled between the first output port and the second output port of the differential driver circuit.

4. The apparatus according to claim 2, wherein the feedback control circuit includes:
a first comparator coupled to a first output pad and the first tap;
wherein the first output pad is coupled to the first output port;
a second comparator coupled to a second output pad and the second tap;
wherein the second output pad is coupled to the second output port;
a state machine coupled to an up signal output of the first comparator and configured to provide the first digital output;
the state machine further coupled to a down signal output of the second comparator and configured to provide the second digital output; and
the state machine yet further coupled to receive a sample or strobe signal for sampling the up signal output and the down signal output for respectively providing the first digital output and the second digital output.

5. The apparatus according to claim 2, wherein the feedback control circuit includes:
a multiplexer coupled to a first output pad, a second output pad, the first tap, and the second tap;
the multiplexer further coupled to receive a select signal;
wherein the first output pad is coupled to the first output port;
wherein the second output pad is coupled to the second output port;
a first pair of voltages associated with the first output pad and the first tap for a selected output from the multiplexer responsive to a first state of the select signal;
a second pair of voltages associated with the second output pad and the second tap for the selected output from the multiplexer responsive to a second state of the select signal;
an analog-to-digital converter coupled to receive the selected output from the multiplexer for conversion of the selected output into a third digital output; and
a lookup table and converter coupled to receive the third digital output and configured to provide the first digital output and the second digital output responsive to the third digital output and at least a portion of the select signal.

6. The apparatus according to claim 2, wherein:
the first impedance-voltage device is at least one PMOS transistors coupled for gating with the first analog voltage; and
the second impedance-voltage device is at least one NMOS transistors coupled for gating with the second analog voltage.

7. The apparatus according to claim 2, wherein:
the first impedance-voltage device is a first amplifier coupled to receive the first analog voltage;
a first amplifier output of the first amplifier is the first bias voltage coupled to be provided to the first bias node;
the first amplifier output of the first amplifier is further coupled to provide the first bias voltage as a first feedback input to the first amplifier;
the second impedance-voltage device is a second amplifier coupled to receive the second analog voltage;
a second amplifier output of the second amplifier is the second bias voltage coupled to be provided to the second bias node; and
the second amplifier output of the second amplifier is further coupled to provide the second bias voltage as a second feedback input to the second amplifier.

8. A method for impedance adjustment, comprising:
outputting a first analog voltage from a first analog voltage source in response to a first digital output;
outputting a second analog voltage from a second analog voltage source in response to a second digital output;
applying the first analog voltage to a first impedance-voltage device to provide a first channel resistance;
applying the second analog voltage to a second impedance-voltage device to provide a second channel resistance;
obtaining a first bias voltage from the first impedance-voltage device responsive to the first channel resistance;
wherein the first impedance-voltage device is sourced from a supply voltage;
obtaining a second bias voltage from the second impedance-voltage device responsive to the second channel resistance;
wherein the second impedance-voltage device is sourced from a ground;
providing the first bias voltage to a first bias node of a differential driver circuit;
providing the second bias voltage to a second bias node of the differential driver circuit;

providing an input voltage to an input port of the differential driver circuit;
outputting a logic high voltage from a first output port of the differential driver circuit; and
outputting a logic low voltage from a second output port of the differential driver circuit.

9. The method according to claim 8, further comprising:
generating a first reference voltage and a second reference voltage with a reference resistance circuit;
wherein the reference resistance circuit has a first tap and a second tap for sourcing the first reference voltage and the second reference voltage, respectively;
generating the first digital output from a feedback control circuit responsive to a first relationship between the logic high voltage and the first reference voltage;
generating the second digital output from the feedback control circuit responsive to a second relationship between the logic low voltage and the second reference voltage;
adjusting the first digital output by the feedback control circuit responsive to the first relationship to adjust impedance of the first impedance-voltage device responsive to the first analog voltage; and
adjusting the second digital output by the feedback control circuit responsive to the second relationship to adjust impedance of the second impedance-voltage device responsive to the second analog voltage.

10. The method according to claim 9, wherein the feedback control circuit is further configured for:
setting a pull-up value;
setting a pull-down value;
sampling an up signal output associated with the pull-up value and a down signal output associated with the pull-down value;
determining whether the up signal output indicates that a high output voltage is greater than a voltage output high level at the first output port;
determining whether the down signal output indicates that a low output voltage is greater than a voltage output low level at the second output port;
responsive to the high output voltage being greater than the voltage output high level and the low output voltage being less than the voltage output low level, decrementing both the pull-up value and the pull-down value;
responsive to the high output voltage being greater than the voltage output high level and the low output voltage being greater than the voltage output low level, incrementing the pull-down value;
responsive to the high output voltage being less than the voltage output high level and the low output voltage being greater than the voltage output low level, incrementing both the pull-up value and the pull-down value; and
responsive to the high output voltage being less than the voltage output high level and the low output voltage being less than the voltage output low level, incrementing the pull-up value.

11. The method according to claim 10, further comprising:
inputting the pull-up value to a first digital-to-analog converter to provide the first analog voltage;
wherein the first digital-to-analog converter is the first analog voltage source;
inputting the pull-down value to a second digital-to-analog converter to provide the second analog voltage;
wherein the second digital-to-analog converter is the second analog voltage source;
generating the first bias voltage by providing the first analog voltage to the first impedance-voltage device;
generating the second bias voltage by providing the second analog voltage to the second impedance-voltage device; and
biasing the differential driver circuit with the first bias voltage and the second bias voltage to provide the high output voltage and the low output voltage, respectively.

12. The method according to claim 11, further comprising:
providing a high reference voltage and a low reference voltage;
comparing the high reference voltage with the high output voltage to provide the up signal output; and
comparing the low reference voltage with the low output voltage to provide the down signal output.

13. The method according to claim 10, further comprising:
adjusting the impedance of a finite impulse response ("FIR") filter, including:
providing a fixed number of slices N for N a positive integer greater than one;
grouping the fixed number of slices into a main cursor group and at least one other group selected from a post cursor group and a precursor group; and
providing a pull-up analog voltage and a pull-down analog voltage to each of the fixed number of slices N for adjustment of the impedance of the FIR filter to match a transmission impedance.

14. An apparatus for impedance adjustment, comprising:
a differential driver circuit having an input port, a first output port, a second output port, a first bias node, and a second bias node;
a reference resistance circuit having a first tap and a second tap;
a feedback control circuit coupled to the first output port, the second output port, the first tap, and the second tap;
wherein the feedback control circuit is configured to provide a first digital output in response to a first relationship between first voltages at the first output port and the first tap;
wherein the feedback control circuit is further configured to provide a second digital output in response to a second relationship between second voltages at the second output port and the second tap;
wherein the first digital output is provided to select a number of pull-up slices; and
wherein the second digital output is provided to select a number of pull-down slices.

15. The apparatus according to claim 14, wherein the feedback control circuit includes an analog-to-digital converter for providing the first digital output and the second digital output.

16. The apparatus according to claim 14, wherein:
the feedback control circuit is configured to:
provide the first digital output in response to the first relationship between first voltages at the first output port and the first tap; and
provide the second digital output in response to the second relationship between second voltages at the second output port and the second tap;
activate the number of pull-up slices selected responsive to the first digital output; and
activate the number of pull-down slices selected responsive to the second digital output.

17. The apparatus according to claim 16, wherein:
the feedback control circuit is coupled to receive a high output voltage from the first output port;

the feedback control circuit is further coupled to receive a first reference voltage at the first tap;

the analog-to-digital converter is coupled to receive the high output voltage and the first reference voltage to provide in response thereto a first code value; and a lookup table and converter of the feedback control circuit is coupled to receive the first code value to obtain a first thermometer conversion value to provide the first digital output.

18. The apparatus according to claim 17, wherein:

the feedback control circuit is coupled to receive a low output voltage from the second output port;

the feedback control circuit is further coupled to receive a second reference voltage at the second tap;

the analog-to-digital converter is coupled to receive the low output voltage and the second reference voltage to provide in response thereto a second code value; and the lookup table and converter of the feedback control circuit is coupled to receive the second code value to obtain a second thermometer conversion value to provide the second digital output.

19. The apparatus according to claim 18, wherein:

the feedback control circuit includes the analog-to-digital converter which is part of a system monitor; and the system monitor determines impedance values for a slice to provide the first code value and the second code value for looking up the first thermometer conversion value and the second thermometer conversion value, respectively.

20. The apparatus according to claim 14, wherein the number of pull-up slices is different than the number of pull-down slices.

\* \* \* \* \*